United States Patent
Suekawa

(10) Patent No.: US 7,888,733 B2
(45) Date of Patent: Feb. 15, 2011

(54) POWER SEMICONDUCTOR DEVICE

(75) Inventor: Eisuke Suekawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 139 days.

(21) Appl. No.: 11/747,503

(22) Filed: May 11, 2007

(65) Prior Publication Data
US 2008/0079069 A1  Apr. 3, 2008

(30) Foreign Application Priority Data
Sep. 29, 2006  (JP)  ............... 2006-267137

(51) Int. Cl.
*H01L 29/739* (2006.01)
(52) U.S. Cl. ............... 257/330; 257/331; 257/E29.028; 257/E29.067
(58) Field of Classification Search ................ 257/288, 257/302, 328, 329, 330, 331, 378, E29.027, 257/E29.04, E29.039, E29.066
See application file for complete search history.

(56) References Cited

U.S. PATENT DOCUMENTS

| | | | |
|---|---|---|---|
| 5,751,024 A | 5/1998 | Takahashi | |
| 5,940,721 A | 8/1999 | Kinzer et al. | |
| 6,001,678 A | 12/1999 | Takahashi | |
| 6,040,599 A | 3/2000 | Takahashi | |
| 6,060,747 A * | 5/2000 | Okumura et al. | 257/331 |
| 6,072,214 A | 6/2000 | Herzer et al. | |
| 6,221,721 B1 | 4/2001 | Takahashi | |
| 6,451,644 B1 | 9/2002 | Yu | |
| 6,737,705 B2 * | 5/2004 | Momota et al. | 257/330 |
| 6,768,168 B1 | 7/2004 | Takahashi | |
| 6,809,349 B2 * | 10/2004 | Yamaguchi et al. | 257/133 |
| 7,250,639 B1 | 7/2007 | Suekawa | |

2002/0053696 A1 * 5/2002 Iwamuro et al. ............ 257/329

(Continued)

FOREIGN PATENT DOCUMENTS

GB  2 306 249 A  4/1997

(Continued)

OTHER PUBLICATIONS

J. B. Baliga, "Power Semiconductor Devices, Chapter 8 Insulated Gate Bipolar Transistor", PWS Publishing Company, XP002455756, 1996, pp. 426-434, 474-475 and 386-387.

(Continued)

*Primary Examiner*—Victor A Mandala
*Assistant Examiner*—Scott Stowe
(74) *Attorney, Agent, or Firm*—Oblon, Spivak, McClelland, Maier & Neustadt, L.L.P.

(57) ABSTRACT

A power semiconductor having a first, second, third, and fourth semiconductor layer on top of each other, two trench gates parallel and adjacent to each other, each having a trench in the fourth semiconductor layer with the a trench bottom portion reaching into the third semiconductor layer, a gate insulation film lining the trench, and a gate electrode filling the trench being lined with the gate insulation film, two first semiconductor region regions provided contiguously bordering on one side of each of the two trench gates, located at the outer sides of each of the two adjacent trench gates, and located in the top side of the fourth semiconductor layer, a first main electrode on the fourth semiconductor layer, and a second main electrode provided on a bottom of the first semiconductor layer.

9 Claims, 10 Drawing Sheets

U.S. PATENT DOCUMENTS

2002/0179976 A1    12/2002    Takahashi

FOREIGN PATENT DOCUMENTS

| JP | 8-316479 | 11/1996 |
|---|---|---|
| JP | 10-93077 | 4/1998 |
| JP | 10-178176 | 6/1998 |
| JP | 2002-353456 | 12/2002 |

OTHER PUBLICATIONS

U.S. Appl. No. 11/747,503, filed May 11, 2007, Suekawa.

"Transistor Technology Special", No. 85, Jan. 1, 2004, 4 Pages, Fig. 3-Fig. 10, CQ Publishing Co., Ltd., Tokyo, Japan, (with English Abstract).

"Power semiconductor device and power IC handbook", Jul. 30, 1996, 4 Pages, Fig. 6.28 (a), Corona Publishing Co., Ltd., Tokyo, Japan, (with Partial English Translation).

* cited by examiner

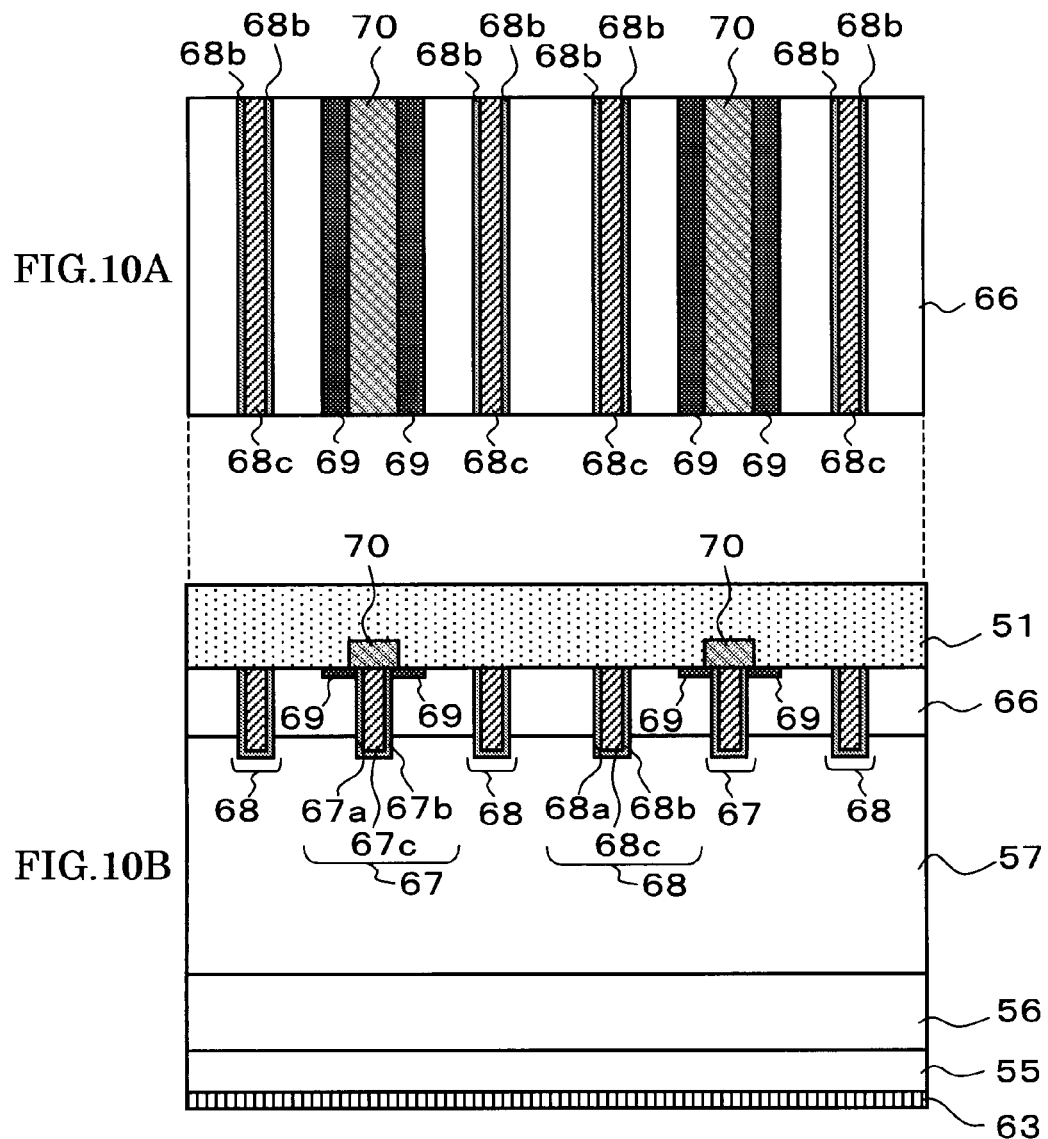

POWER SEMICONDUCTOR DEVICE

BACKGROUND OF THE INVENTION

1. Field of the Invention

The present invention relates to power semiconductor devices having a MOS-gate-metal-oxide semiconductor gate-structure, especially to an insulated gate bipolar transistor used in devices such as invertors that transform or control electric power.

2. Description of the Related Art

In recent years, insulated gate bipolar transistors (hereinafter referred as IGBTs) are utilized, in many cases, as power semiconductor devices including invertors that transform or control electric power. Also, IGBTs are required to obtain larger current capacity (higher withstand voltage) and higher reliability.

FIG. 7 is a plane view of an IGBT-chip that is illustrated in Patent Document 1, for example. In the IGBT-chip 50 illustrated in FIG. 7, a numeral '51' represents an emitter electrode (a first main electrode); '52', a gate pad formed at a concave portion that is provided on a peripheral portion of the emitter electrode 51; '53', gate wiring that extends from the gate pad 52 and is provided on peripheral surface of the emitter electrode 51 and on the inner surface; thereof so as to divide the emitter electrode 51 into strips. IGBT cells 54 having a cellular structure are formed in spaces divided by the gate wire 53.

For example, FIG. 8 is a partially sectional view along Line A-A of one of the IGBT cells 54 in FIG. 7, and shows a cellar structure of a general planar-gate-type IGBT illustrated in Non-Patent Document 1. In FIG. 8, a numeral '55' represents a $p^+$ collector layer (a first semiconductor layer of a first conductivity type) made of a semiconductor substrate; '56', an $n^+$ buffer layer (a second semiconductor layer of a second conductivity type) provided on the top side of the $p^+$ collector layer 55; '57', an $n^-$ layer (a third semiconductor layer of the second conductivity type) provided on the $n^+$ buffer layer 56; '58', a p base region (a first semiconductor region of the first conductivity type) provided selectively in the top side of the $n^-$ layer 57; '59', an $n^+$ emitter region (a second semiconductor region of the second conductivity type) provided selectively in the top side of the p base region 58; '60', a gate insulation film that is made of a dielectric material such as an oxide film and is provided on the $n^-$ layer 57, partially on the $n^+$ emitter region 59 and on the p base region 58 therebetween; '61', a gate electrode that is provided on the gate insulation film 60 and made of a conductive material such as a polysilicon film; '62', an interlayer insulation film that covers the gate electrode 61, the gate insulation film 60 and a portion of the $n^+$ emitter region 59, and is made of a dielectric material such as a silicate glass (hereinafter, referred as a BPSG); '51', an emitter electrode, shown in FIG. 7, that is made of a conductive material such as aluminum and is provided so as to cover on the interlayer insulation film 62, the p base region 58 and a portion of the $n^+$ emitter region 59. A numeral '63' represents a collector electrode (a second main electrode) that is provided on the bottom surface of the $p^+$ collector layer 55 and is made of a conductive material such as aluminum. In addition, the gate electrode 61 is connected to the gate wiring 53 at the electrode ends provided in its extension orientation (in the front-back orientation with respect to the document face in FIG. 8).

Moreover, FIG. 9 is a partially sectional view along Line A-A of the one of IGBT cells 54 in FIG. 7; the figure shows a cellular structure of a planar-gate-type IGBT that has a terrace gate structure shown in Patent Document 2. A terrace gate portion 65 is provided on the $n^-$ layer 57 in FIG. 9, which differs from FIG. 8; whose feature is that the IGBT has a thicker gate insulation film 60 than that of the average planar-gate-type IGBT. Herewith, the capacity of the gate insulation film becomes smaller, reducing its feedback capacity. In addition, in FIG. 9, the portions that are identical or equivalent to those in FIG. 8 are represented by the same numerals as those in FIG. 8 so as to omit their explanations.

FIG. 10A and FIG. 10B are a plane view and a partially sectional view along Line A-A of one of the IGBT cells 54 in FIG. 7, respectively; the views illustrate a cellular structure of a trench-gate-type IGBT including a trench that does not work as gate (hereinafter, referred as a dummy trench); the views illustrate, for example, the equivalent IGBT described in Patent Document 2. FIG. 10A shows the IGBT structure, in which the emitter electrode 51 is removed for easy understanding. In FIG. 10, the $p^+$ collector layer 55, the $n^+$ buffer layer 56, the $n^-$ layer 57, the emitter electrode 51 and the collector electrode 63 are the portions that are identical or equivalent to those shown in FIG. 8, so that they will be represented by the same numerals as those in FIG. 8 so as to omit their explanations. A numeral '66' represents a p base layer (a fourth semiconductor layer of the first conductivity type) provided on the $n^-$ layer 57; a numeral '67' represents a trench gate that extends from the top of the p base layer 66 and reaches the $n^-$ layer 57; the trench gate 67 includes a trench 67a, a gate insulation film 67b that lines the trench 67a and is made of a dielectric material such as an oxide film, and a gate electrode 67c that is provided to fill the trench 67a being lined with the gate insulation film 67b and is made of a conductive material such as polysilicon. A numeral '68' represents a dummy trench that extends from the top of the p base layer 66 and reaches the $n^-$ layer 57; the dummy trench 68 includes a trench 68a, a gate insulation film 68b that lines the trench 68a and is made of a dielectric material such as an oxide film, and a dummy electrode 68c that is provided to fill the trench 68a being lined with the gate insulation film 68b and is made of a conductive material such as polysilicon so as to be electrically connected to the emitter electrode 51. A numeral '69' represents an $n^+$ emitter region provided in the top of the p base layer 66, contiguously bordering on both sides of the trench gate 67; a numeral '70', an interlayer insulation film that covers a portion of the $n^+$ emitter region 69 and the trench gate 67; the numeral '51', the emitter electrode shown in FIG. 7 that covers uncovered portions of the interlayer insulation film 70, the p base layer 66, the dummy trench 68 and the $n^+$ emitter region 69. With the dummy trenches being provided, current flowing into the IGBT chip 50 due to short circuits can be curbed, which enables the device to secure a short circuit safe operation area (hereinafter, referred as SCSOA) and is effective for increasing current capacity of the device. Here, the end of the gate electrode 67c is connected to the gate wiring 53.

Patent Documentation 1
  Japanese Patent Laid-Open No. 1996-316479 (FIG. 1)

Patent Documentation 2
  Japanese Patent Laid-Open No. 2002-353456 (FIG. 1)

Non-Patent Documentation 1
  "Transistor Technology Special," No. 85 Jan. 1, 2004, page 44 (FIG. 3 through FIG. 10), CQ Publishing Co. Ltd., Tokyo, Japan Non-Patent Documentation 2
  "Power Semiconductor Device and Power IC Handbook," 1996, page 151 (FIG. 6.28a), Corona Publishing Co., Ltd.

An IGBT that is a conventional power semiconductor device has been configured as described above; recently, it is required that IGBTs obtain larger current capacity (higher withstand voltage) and higher reliability; the following problems have now drawn attention in order to meet those requirements.

In the IGBT chip 50, in order to reduce each gate resistance (represented as 'R' in FIG. 7) of the gate electrodes 61 and 67c formed of a conductive material such as polysilicon, the gate wiring 53 formed of a conductive material such as aluminum is provided as shown in FIG. 7, so as to divide the emitter electrode 51 into strips. In order to cope with larger current capacity and higher reliability, the number of wires that are made of a conductive material such as aluminum and bonded to the emitter electrode 51 tends to increase in an IGBT package where the IGBT chip 50 is mounted. Therefore, in order to enhance the reliability of the wire-bonding, it is necessary to enlarge areas for each strip of the emitter electrode 51 by giving more spaces between the gate wiring 53; however, enlarging the areas meanwhile causes big difference between the gate resistances of the gate electrodes 61 and 67c, as have been described above. More specifically, in the IGBT cells 54, when a cell is located near to the gate wiring 53, the gate resistance thereof becomes small; when it is located apart from the gate wiring 53 (for example, located at the intermediary point between the gate wiring), the gate resistance thereof becomes large. Therefore, when the IGBT chip turns off, a current supplied to one of the IGBT cells 54 close to the gate wiring 53 and a current supplied to another one of the IGBT cells 54 apart from the gate wiring are not balanced (hereinafter, referred as imbalance among current diversions); then, currents are concentrated on such IGBT cells 54 that are located apart from the gate wiring 53 and whose turning off speed becomes slow, so that the IGBT cells generate heat; therefore, turn-off withstand ability, that is, a reverse-biased safe operating area (hereinafter, referred as RBSOA), becomes reduced.

As a means for reducing the gate resistance of the gate electrodes 61 and 67c, it is considered to use doped polysilicon that is a polysilicon—the material of the gate electrodes 61 and 67c—doped with impurities in order to reduce their resistance. However, when doped silicon is used for the gate electrode 61 of the planar-gate-type IGBT shown in FIG. 8 and FIG. 9, auto-doping of impurities, with which a polysilicon has been doped, into the gate insulation film 60 and the n⁻ layer 57 occurs, adversely affecting the gate-emitter leakage current and the primary-voltage-to-leakage-current characteristics. Also, when doped silicon is used for the gate electrode 67c of the trench-gate-type IGBT shown in FIG. 10, because the width of the trench gate is formed very narrow, the cross-sectional area of the gate electrode 67c becomes small. Therefore, in the above-described case where the spaces between the gate wiring 53 become wider, the gate resistances increase, causing the imbalance among current diversions to occur, so that its turn-off withstand ability will be reduced.

SUMMARY OF THE INVENTION

The present invention is aimed to solve the problems above-described; an object thereof is, even when the spaces between the gate wiring 53 become wide, to provide a power semiconductor device that can meet requirements for larger current capacity and higher reliability while improving imbalance among current diversions.

A power semiconductor device according to the present invention includes a second semiconductor layer of a second conductive type, provided on a top side of a first semiconductor layer of a first conductivity type; a third semiconductor layer of the second conductivity type, provided on the second semiconductor layer; a first semiconductor region of the first conductivity type, provided selectively in a top side of the third semiconductor layer; a second semiconductor region of the second conductivity type, provided selectively in a top side of the first semiconductor region; a gate insulation film provided on the third semiconductor layer, on the first semiconductor region, and partially on the second semiconductor region; a gate electrode provided on the gate insulation film; a first main electrode that is provided on the first semiconductor region and is electrically connected with the second semiconductor region; and a second main electrode provided on a bottom side of the first semiconductor layer. Also, the gate electrode includes a polysilicon film provided on the gate insulation film, and a doped polysilicon film doped with impurities that is provided on the polysilicon film.

According to the present invention, because a power semiconductor device is configured so as to have a gate electrode including a polysilicon film provided on a gate insulation film, and a doped polysilicon film—a polysilicon doped with impurities to reduce its resistance—that is provided on the polysilicon film; the gate resistance of the gate electrode can be reduced in comparison to conventional ones. Therefore, the imbalance among current diversions at turn-off is improved so as not to reduce turn-off withstand ability of the device. In addition, because a polysilicon film not doped with impurities is provided between a doped polysilicon film and a gate insulation film, it is possible to preclude auto-doping of impurities, which might be feared by providing with the doped polysilicon film, into the gate insulation film and an n⁻ layer from adversely affecting gate-emitter leakage current and collector-emitter leakage current. Therefore, a power semiconductor device that meets requirements for increased current capacity and higher reliability can be obtained.

BRIEF DESCRIPTION OF THE DRAWINGS

FIG. 10 is a partial cross-sectional view illustrating a trench-gate-type IGBT with a dummy trench structure that is a conventional power semiconductor device.

DETAILED DESCRIPTION OF PREFERRED EMBODIMENTS

Embodiment 1

Figure 1:
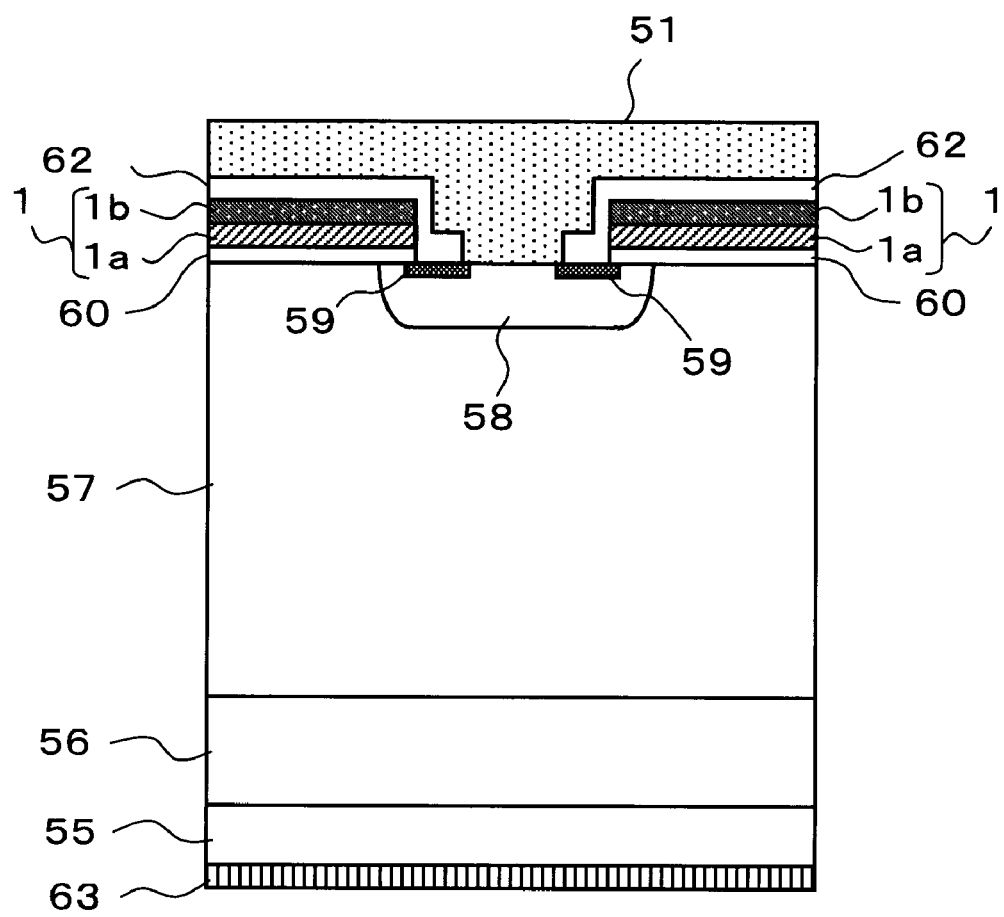
FIG. 1 is a partial cross-sectional view illustrating a planar-gate-type IGBT that is a power semiconductor device according to Embodiment 1 of the present invention.

Embodiment 1 according to the present invention will be explained below. FIG. 1 is a partial cross-sectional view illustrating a planar-gate-type IGBT that is a power semiconductor device according to Embodiment 1 of the present invention; the figure illustrates, taking along the line A-A, a cross-sectional cellar structure of the IGBT cells 54 shown in FIG. 7. FIG. 1 differs from FIG. 8 that represents prior art as follows; a gate electrode includes a polysilicon film 1*a* provided on the gate insulation film 60, and a doped polysilicon film 1*b* that is doped with impurities and provided on the polysilicon film 1*a*; the gate electrode 1 is connected to the gate wiring 53 at the electrode ends provided in its extension orientation (in the front-back orientation with respect to the document face in FIG. 1). Because the other components are identical or equivalent to those in FIG. 8, the same numerals will be used so as to omit their explanations.

According to the structure shown in FIG. 1, because the gate electrode includes the polysilicon film 1*a* provided on the gate insulation film 60, and the doped polysilicon film 1*b* that is doped with impurities to reduce its resistance and is provided on the polysilicon film 1*a*, the gate resistance of the gate electrode 1 can be reduced in comparison to conventional ones. Therefore, the difference between the gate resistance of a first one of the IGBT cells 54 close to the gate wiring 53 and that of a second one of the IGBT cells 54 apart from the gate wiring (for example, being located at the intermediary point between the gate wiring) becomes small. Therefore, when the IGBT cells 54 turn off, the imbalance between a current supplied to the first one of the IGBT cells 54 close to the gate wiring 53 and a current supplied to the second one of the IGBT cells 54 apart from the gate wiring 53 is improved; because currents are not concentrated at the second one of the IGBT cells 54 apart from the gate wiring 53, the IGBT cell does not generate heat, so as to prevent its turn-off withstand ability from reducing.

In addition, because the polysilicon film 1*a* not doped with impurities is provided between the doped polysilicon film 1*b* and the gate insulation film 60, the impurities contained in the doped polysilicon film 1*b* are prevented from naturally diffusing, namely, auto-doping into the gate insulation film 60 and the n⁻ layer 57. Therefore, it is possible to preclude expected influence of auto-doping on gate-emitter leakage current and collector-emitter leakage current.

Even when the spaces between the gate wiring 53 become wide, because improvement in imbalance among current diversions prevents the turn-off withstand ability from reducing and, in addition, because it is possible to preclude, by curbing auto-doping of the impurities, expected influence on gate-emitter leakage current and collector-emitter leakage current, a planar type IGBT that meets requirements for increased current capacity (higher withstand voltage) and higher reliability can be obtained.

Embodiment 2

Figure 2:
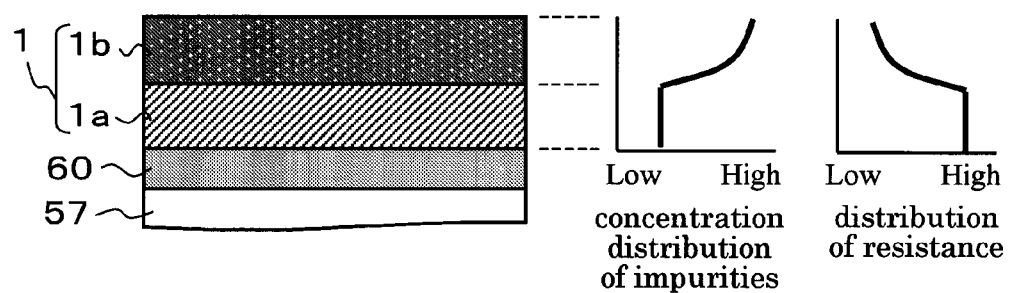
FIG. 2 is a partially enlarged view illustrating a planar-gate-type IGBT that is a power semiconductor device according to Embodiment 2 of the present invention.
Figure 8:
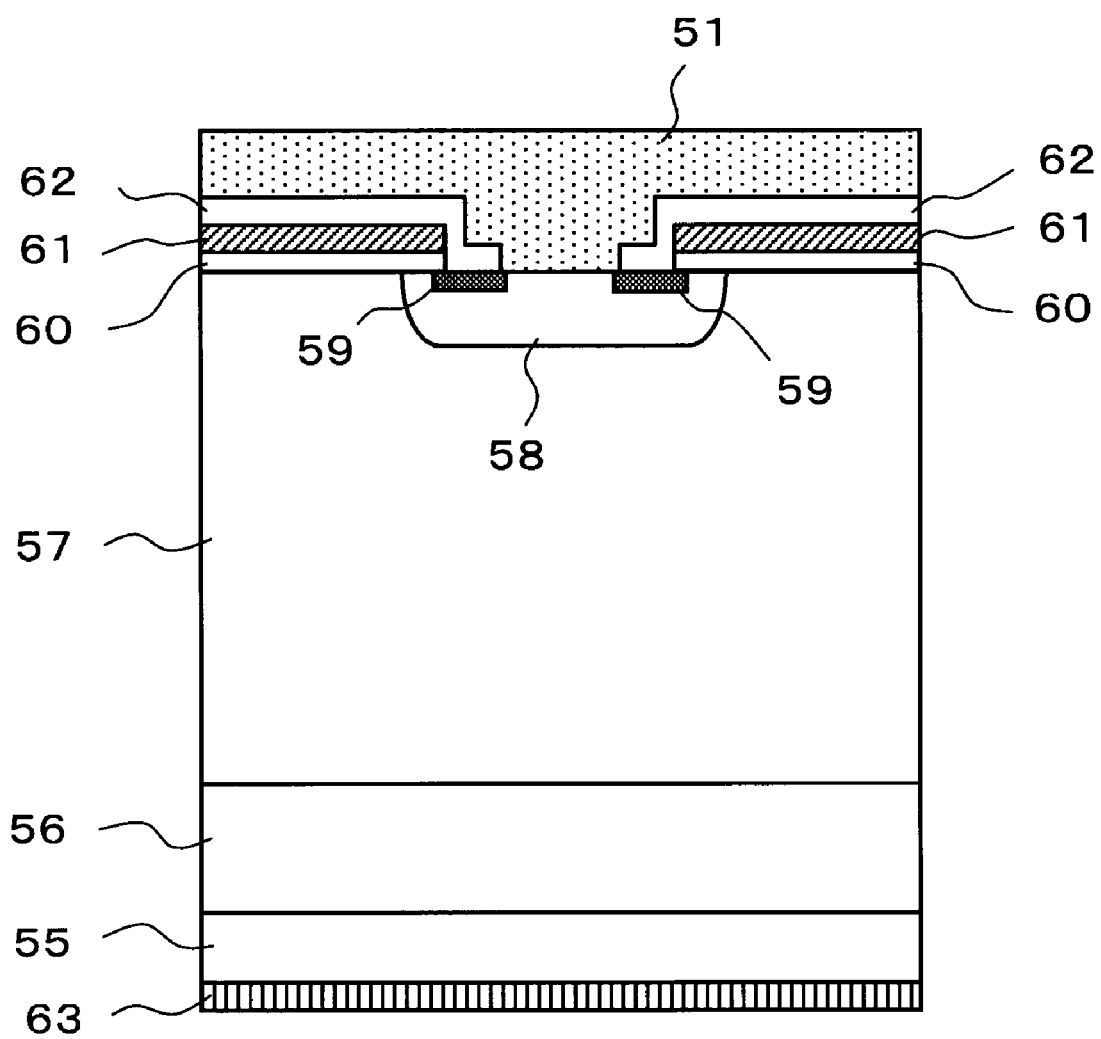
FIG. 8 is a plane view illustrating a planar-gate-type IGBT that is a conventional power semiconductor device.

In Embodiment 1, a gate electrode 1 has been explained, in which the gate electrode 1 is configured with the polysilicon film 1*a* provided on the gate insulation film 60, and the doped polysilicon film 1*b* that is doped with impurities to reduce its resistance and is provided on the polysilicon film 1*a*. One of FIG. 2 is a partially enlarged view for explaining Embodiment 2; the figure corresponds to a view in which the gate electrode 1 in FIG. 1 is partially enlarged. Embodiment 2 differs from Embodiment 1 in that gradient of concentration with respect to impurities is provided in the doped polysilicon film 1*b*. More specifically, as distribution of its impurity concentration shown in the middle view of FIG. 2, the impurity concentration is made to vary in a thickness direction of the doped polysilicon film 1*b*; at the top portion of the doped polysilicon 1*b*, the value of impurity concentration takes its maximum value; the value becomes smaller heading thickness-wise toward the polysilicon film 1*a*; at the bottom portion of the doped polysilicon film 1*b*, which is contiguous with the polysilicon, the value takes its lowest value or zero. In addition, in the figure, the portions that are identical or equivalent to those in FIG. 8 are represented by the same numerals as those in FIG. 8 so as to omit their explanations.

Using the structure shown in FIG. 2, the resistance of the gate electrode 1 becomes distributed as shown in the right view of FIG. 2; the doped silicon film 1*b* has at its top area a portion in which its resistance is reduced, which prevents the turn-off withstand ability from reducing as in the case of Embodiment 1.

In addition, because at the bottom portion of the doped polysilicon film 1*b*, which is contiguous with the polysilicon 1*a*, the value takes its lowest value or zero, the impurities contained in the doped polysilicon film 1*b* are prevented much more than Embodiment 1, from diffusing naturally, namely, auto-doping into the gate insulation film 60 and the n⁻ layer 57. Therefore, it is possible to further preclude expected influence of auto-doping on gate-emitter leakage current and collector-emitter leakage current.

Therefore, even when the spaces between the gate wiring 53 become wide, because improvement in imbalance among current diversions prevents the turn-off withstand ability from reducing and it is possible to preclude expected influence on gate-emitter leakage current and collector-emitter leakage current by curbing auto-doping of the impurities, a planar type IGBT that meets requirements for increased current capacity (higher withstand voltage) and higher reliability, can be obtained.

Embodiment 3

Figure 3:
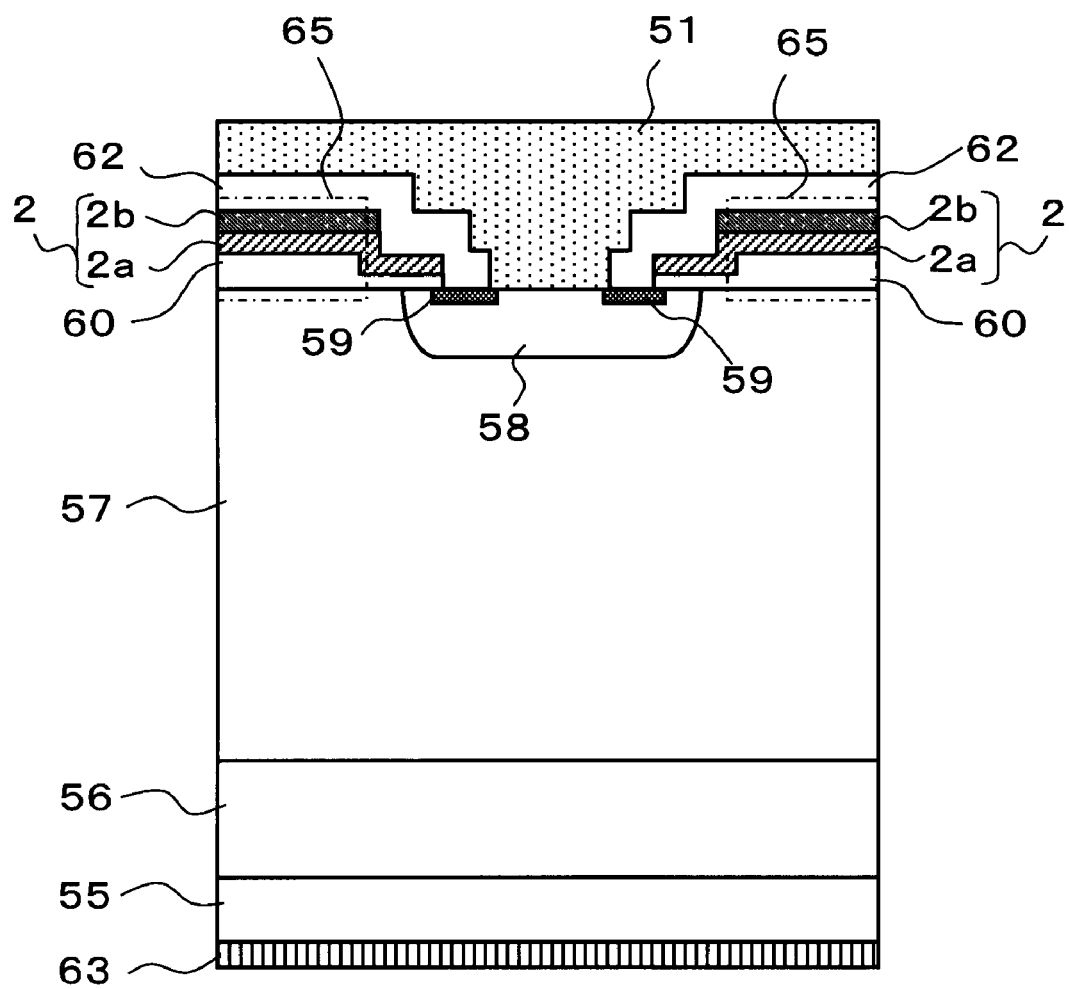
FIG. 3 is a partial cross-sectional view illustrating a planar-gate-type IGBT that is a power semiconductor device according-to Embodiment 3 of the present invention.
Figure 9:
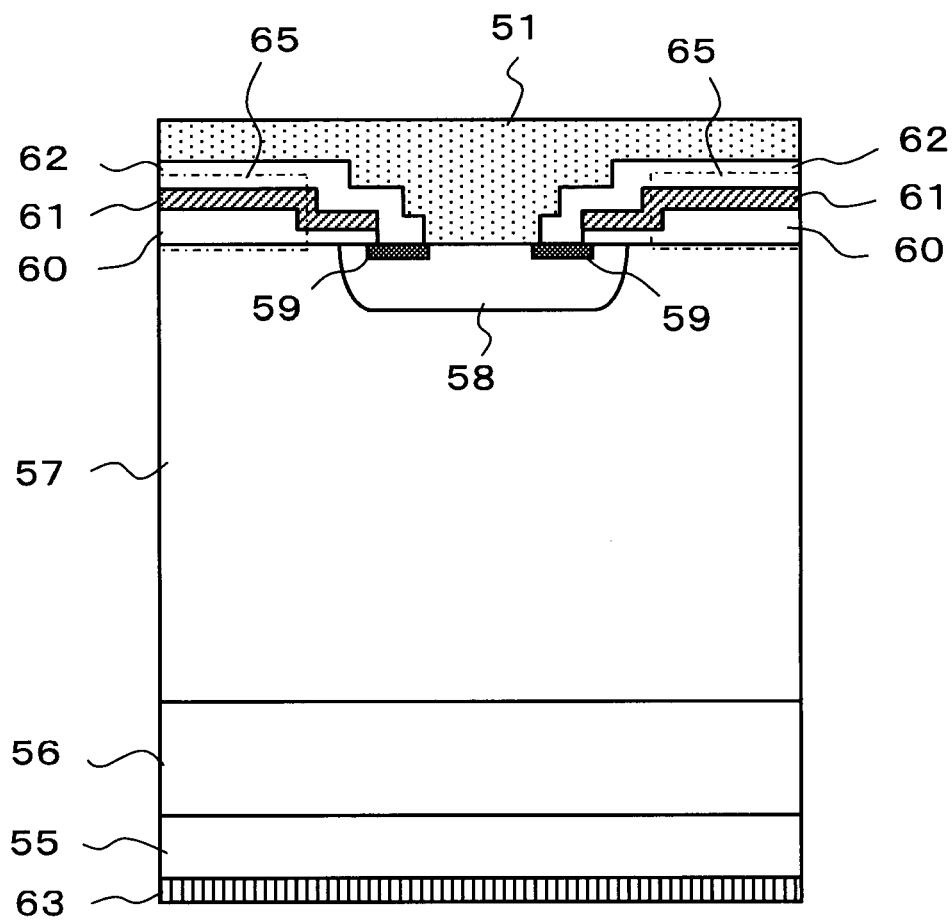
FIG. 9 is a partial cross-sectional view illustrating a planar-gate-type-IGBT, with a terrace gate structure, that is a conventional power semiconductor device.

The gate electrode 1 configured with a polysilicon film 1*a* and a doped polysilicon 1*b* that have been explained in Embodiment 1, is also applicable to a planar-gate-type IGBT that has a terrace gate structure shown in FIG. 9. FIG. 3 is a partial cross-sectional view illustrating a planar-gate-type IGBT that is a power semiconductor device having the terrace gate structure, according to Embodiment 3 of the present invention; the figure illustrates, taking along the line A-A, a cellar structure of the IGBT cells 54 shown in FIG. 7. FIG. 3 differs from FIG. 9 explaining a conventional device, as follows; a terrace gate portion 65 of a gate electrode 2 is configured with a polysilicon film 2*a* provided on a gate insulation film 60, and with the doped polysilicon film 2*b* that is provided on the polysilicon film 2*a* and is doped with impurities to reduce its resistance. In addition, the gate electrode 2 is connected to the gate wiring 53 at the electrode ends provided in its extension orientation (in the front-back orientation with respect to the document face in FIG. 3). Because the other components are identical or equivalent to those in FIG. 8 and FIG. 9, the same numerals will be used so as to omit their explanations.

According to the structure shown in FIG. 3, because the terrace gate portion 65 of the gate electrode 2 is configured with the polysilicon film 2a provided on the gate insulation film 60, and with the doped polysilicon film 2b that is provided on the polysilicon film 2a and is doped with impurities to reduce its resistance, the gate resistance of the gate electrode 2 can be reduced in comparison to that of conventional devices. Therefore, as is the case with Embodiment 1, the turn-off withstand ability of the device can be prevented from reducing.

Also, as is the case with Embodiment 1, the impurities contained in the doped polysilicon film 2b are prevented from diffusing naturally, namely, auto-doping into the gate insulation film 60 and the n⁻ layer 57. Therefore, it is possible to preclude expected influence of auto-doping on gate-emitter leakage current and collector-emitter leakage current.

Therefore, even when the spaces between the gate wiring 53 become wide, because improvement in imbalance among current diversions prevents the turn-off withstand ability from reducing and, in addition, because it is possible to further preclude expected influence on gate-emitter leakage current and collector-emitter leakage current by curbing auto-doping of the impurities, a planar type IGBT that meets requirements for increased current capacity (higher withstand voltage) and higher reliability, can be obtained.

Embodiment 4

In Embodiment 3, a terrace gate has been explained, as follows; the terrace gate portion 65 of the gate electrode 2 is configured with the polysilicon film 2a provided on the gate insulation film 60, and with the doped polysilicon film 2b that is provided on the polysilicon film 2a and is doped with impurities to reduce its resistance. In the doped polysilicon film 2b, the value of impurity concentration may vary in a similar fashion to that of Embodiment 2. In this case, as is the case with Embodiment 2, because the turn-off withstand ability is prevented from reducing and the impurities contained in the doped polysilicon film 2b are prevented from diffusing naturally, namely, auto-doping into the gate insulation film 60 and the n⁻ layer 57, it is possible to preclude expected influence of auto-doping on gate-emitter leakage current and collector-emitter leakage current. Therefore, a planar-gate-type IGBT can be obtained that meets requirements for increased current capacity and higher reliability.

Embodiment 5

Figure 4:
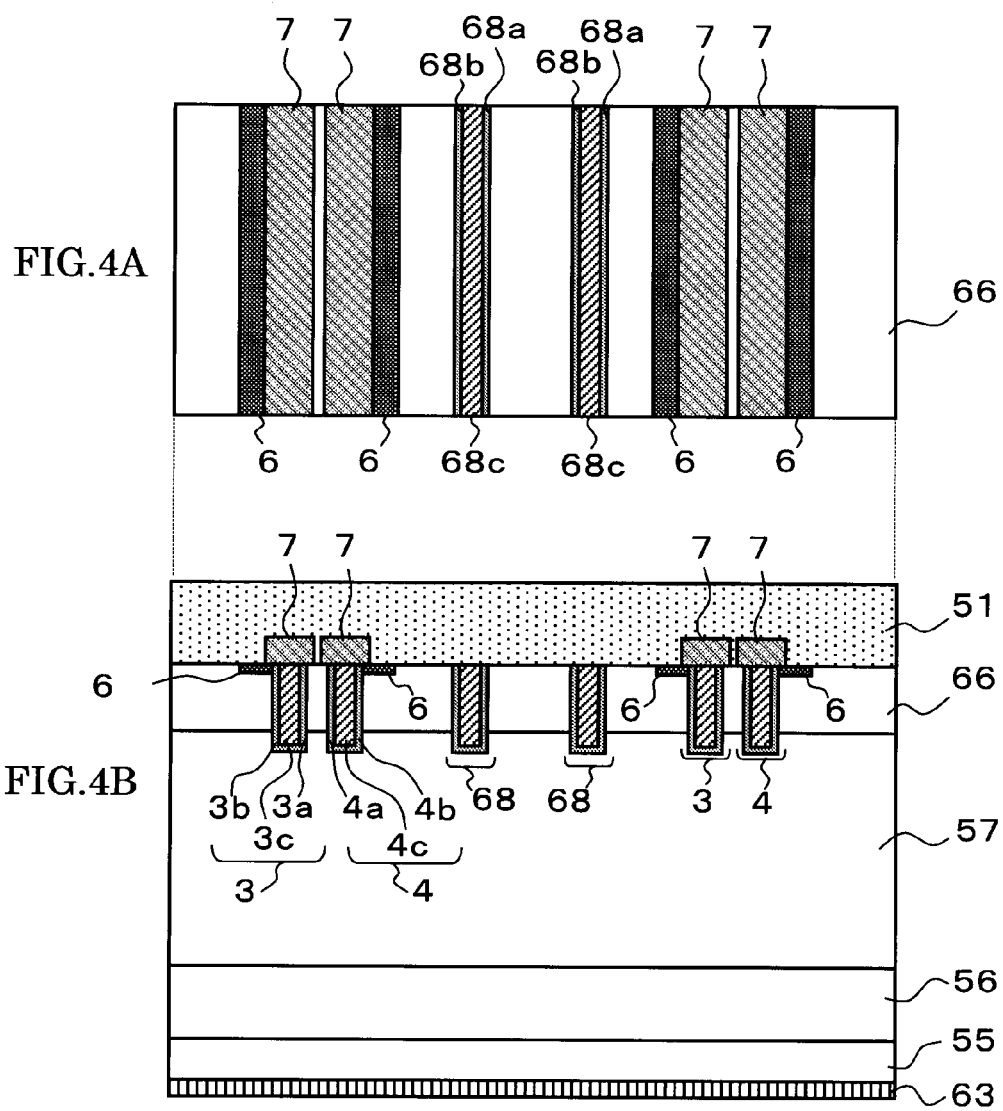
FIG. 4A and FIG. 4B are a plane view and a partial cross-sectional view illustrating a trench-gate-type IGBT that is a power semiconductor device according to Embodiment 5 of the present invention.

Embodiment 5 according to the present invention will be explained below. FIG. 4A and FIG. 4B are a plane view and a partially sectional view along Line A-A of one of the IGBT cells 54 in FIG. 7, in which the figures illustrate a cellular structure of a trench-gate-type IGBT that is a power semiconductor device including a dummy trench, according to Embodiment 5 of the present invention. FIG. 4A shows the trench-gate-type IGBT structure, in which the emitter electrode 51 is removed for easy understanding. In FIG. 4, components, such as the p⁺ collector layer 55 (a first semiconductor layer of a first conductivity type), the n⁺ buffer layer 56 (a second semiconductor layer of a second conductivity type), the n⁻ layer. 57 (a third semiconductor layer of the second conductivity type), the emitter electrode 51 (a first main electrode), the collector electrode 63 (a second main electrode), the p base layer 66 (a fourth semiconductor layer of the first conductivity type), and the dummy trench 68 (the trench 68a, the insulation film 68b, and the dummy electrode 68c), are identical or equivalent to those in FIG. 10, the same numerals will be used for the components so as to omit their explanation. Numerals '3' and '4' represent two trench gates that are provided in parallel and adjacent to each other and extend from the top of the p base layer 66 with the trench bottom portion reaching the n⁻ layer 57. The two trench gates 3 and 4 include trenches 3a and 4a; gate insulation films 3b and 4b that line the trenches 3a and 4a and are made of a dielectric material such as an oxide film; and gate electrodes 3c and 4c that are provided to fill the trenches 3a and 4a being lined with the gate insulation films 3b and 4b and are made of a conductive material such as polysilicon. A numeral '6' represents n⁺ emitter regions (first semiconductor regions of the second conductivity type) each of which is provided in the top of the p base layer 66, contiguously bordering on only one side of each of the two trench gates 3 and 4. In FIG. 4, in order to dispose the two trench gates 3 and 4 close to each other, the n⁺ emitter regions 6 are provided on both outer sides of the two trench gates 3 and 4. A numeral '7' represents an interlayer insulation film that covers a portion of the n⁺ emitter regions 6 and the two trench gates 3 and 4; the numeral '51', the emitter electrode shown in FIG. 7 that covers uncovered portions of the interlayer insulation film 7, the p base layer 66, the dummy trench 68 and the n⁺ emitter regions 6. In addition, the gate electrodes 3c and 4c are connected to the gate wiring 53 at the electrode ends provided in their extension orientation (in the top-bottom orientation of the document in FIG. 4A, or in the front-back orientation with respect to the document face in FIG. 4B).

According to the structure shown in FIG. 4, the n⁻ layer 6 is provided, contiguously bordering on only one side of each of the two trench gates 3 and 4 that are provided in parallel and adjacent to each other, and in the top of the p base layer 66; the two trench gates 3 and 4 come into operation as if they were one trench gate so as to substantially increase the cross-sectional area of the gate electrode; more specifically, the cross-sectional area of the gate electrode is increased to be the sum of the areas of the gate electrode 3c of the trench gate 3 and the gate electrode 4c of the trench gate 4; the gate resistance can be resultantly reduced in comparison to a conventional one. Therefore, the difference between the gate resistance of the first one of the IGBT cells 54 close to the gate wiring 53 and that of the second one of the IGBT cells 54 apart from the gate wiring 53 (for example, being located at the intermediary point between the gate wiring) becomes small. Therefore, when the IGBT cells turn off, the imbalance between the first one of the IGBT cells 54 close to the gate wiring 53 and the second one of the IGBT cells 54 apart from the gate wiring 53 is improved; because currents are not concentrated at the second one of the IGBT cells 54 apart from the gate wiring 53, the IGBT cell does not generate heat, so as to prevent its turn-off withstand ability from reducing.

In addition, because the n⁺ emitter regions 6 are provided on one side of the two trench gates 3 and 4 each, n channel regions emerge only on the one side of each of the gates at turning-off. Therefore, because current loss can be kept low at short circuit, the short circuit safe operation area can be secured even in a case without the dummy trench 68. Furthermore, provision of the dummy trench 68 further secures the short circuit safe operation area.

Therefore, even when the spaces between the gate wiring 53 become wide, because improvement in imbalance among current diversions prevents the turn-off withstand ability from reducing, a trench-gate-type IGBT to meet requirements for increased current capacity and higher reliability can be obtained. Furthermore, provision of the dummy trenches can further secure the short circuit safe operation area; a trench-gate-type IGBT that meets requirements for more increased current capacity and higher reliability can be obtained.

Embodiment 6

Figure 5:
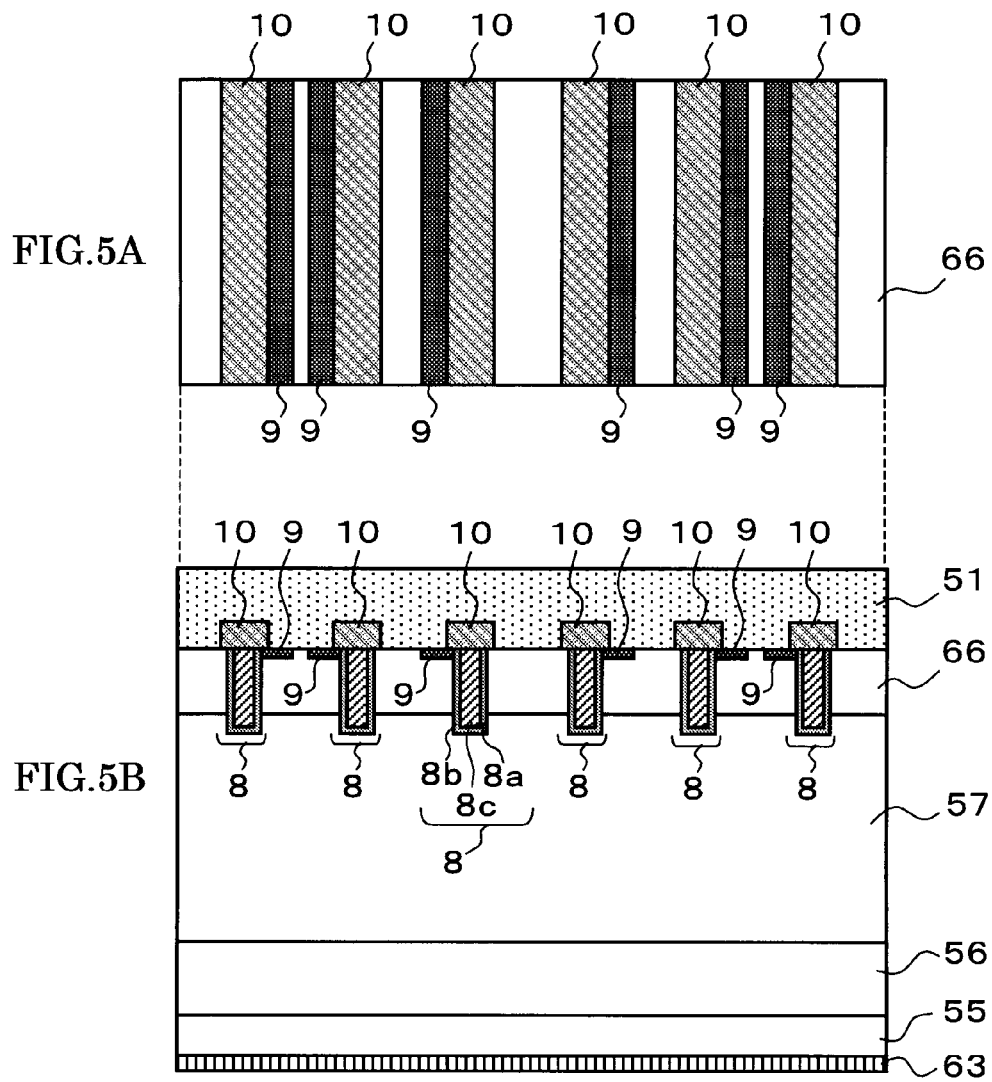
FIG. 5A and FIG. 5B are a plane view and a partial cross-sectional view illustrating a trench-gate-type IGBT that is a power semiconductor device according to Embodiment 6 of the present invention.

Embodiment 6 according to the present invention will be explained below. FIG. 5A and FIG. 5B are a plane view and a partially sectional view along Line A-A of one of the IGBT cells 54 shown in FIG. 7, in which the figures illustrate a cellular structure of a trench-gate-type IGBT that is a power semiconductor device according to Embodiment 6 of the present invention. FIG. 5A shows the trench-gate-type IGBT structure, in which the emitter electrode 51 is removed for easy understanding. In FIG. 5, components such as the $p^+$ collector layer 55 (the first semiconductor layer of the first conductivity type), the $n^+$ buffer layer 56 (the second semiconductor layer of the second conductivity type), the $n^-$ layer 57 (the third semiconductor layer of the second conductivity type), the emitter electrode 51 (the first main electrode), the collector electrode 63 (the second main electrode), and the p base layer 66 (the fourth semiconductor layer of the first conductivity type) are identical or equivalent to those in FIG. 10, the same numerals will be used for the components so as to omit their explanation. A numeral '8' represents a trench gate that extends from the top of the p base layer 66 and reaches the $n^-$ layer 57; the trench gate 8 includes a trench 8*a*, a gate insulation film 8*b* that lines the trench 8*a* and is made of a dielectric material such as an oxide film, and a gate electrode 8*c* that is provided to fill the trench 8*a* being lined with the gate insulation film 8*b* and made of a conductive material such as polysilicon. A numeral '9' represents an $n^+$ emitter region (the first semiconductor region of the second conductivity type) which is provided in the top of the p base layer 66, contiguously bordering on only one side of the trench gate 8; a numeral '10', an interlayer insulation film that covers a portion of the $n^+$ emitter region 9 and the trench gate 8; a numeral '51', the emitter electrode shown in FIG. 7 that covers uncovered portions of the interlayer insulation films 10, the p base layer 66, and the $n^+$ emitter regions 9. In addition, the gate electrodes 8*c* is connected to the gate wiring 53 at the electrode ends provided in its extension orientation (in the top-bottom orientation of the document in FIG. 5A, or in the front-back orientation with respect to the document face in FIG. 5B).

According to the structure shown in FIG. 5, the $n^+$ emitter region 9 is provided in the top of the p base layer 66, contiguously bordering on only one side of the trench gate 8; therefore, a current supplied to the gate electrode 8 can be reduced in comparison to that of conventional devices, the cross-sectional area of the gate electrode 8*c* of the trench gate 8 becomes substantially increased, so that the gate resistance of the trench gate 8 can be reduced in comparison to conventional ones. Therefore, the difference between the gate resistance of the first one of the IGBT cells 54 close to the gate wiring 53 and that of the second one of the IGBT cells 54 apart from the gate wiring 53 (for example, being located at the intermediary point between the gate wiring) becomes small. Therefore, when the IGBT cells turn off, imbalance between the first one of the IGBT cells 54 close to the gate wiring 53 and the second one of the IGBT cells 54 apart from the gate wiring 53 is improved; because currents are not concentrated at the second one of the IGBT cells 54 apart from the gate wiring 53, the IGBT cell does not generate heat, so as to prevent its turn-off withstand ability from reducing.

In addition, because the $n^+$ emitter region 9 is provided on one side of the trench gate 8, an n channel region emerges only on the one side of the trench at turning-off. Therefore, because current loss to short circuit can be curbed to be low, the short circuit safe operation area can be secured. Provision of the dummy trench 68 described in Embodiment 5 can further secure the short circuit safe operation area.

Therefore, even when the spaces between the gate wiring 53 become wide, because improvement in imbalance among current diversions prevents the turn-off withstand ability from reducing, a trench-gate-type IGBT to meet requirements for increased current capacity and higher reliability can be obtained. Provision of the dummy trenches can secure the short circuit safe operation area, so that a trench-gate-type IGBT that meets requirements for more increased current capacity and higher reliability can be obtained.

Embodiment 7

Figure 6:
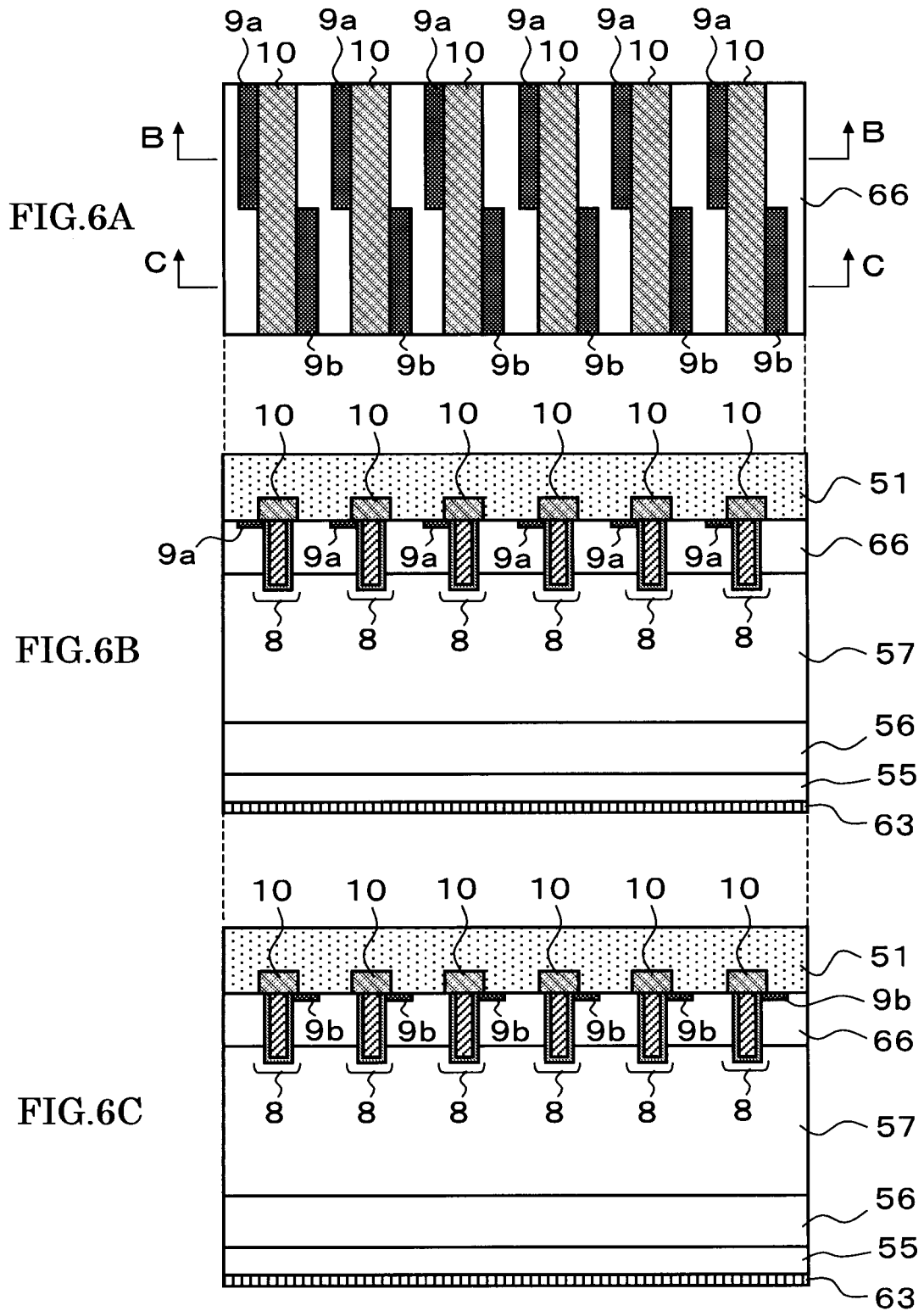
FIG. 6A, FIG. 6B and FIG. 6C are a plane view and partial cross-sectional views illustrating a trench-gate-type IGBT that is a power semiconductor device according to Embodiment 7 of the present invention.
Figure 7:
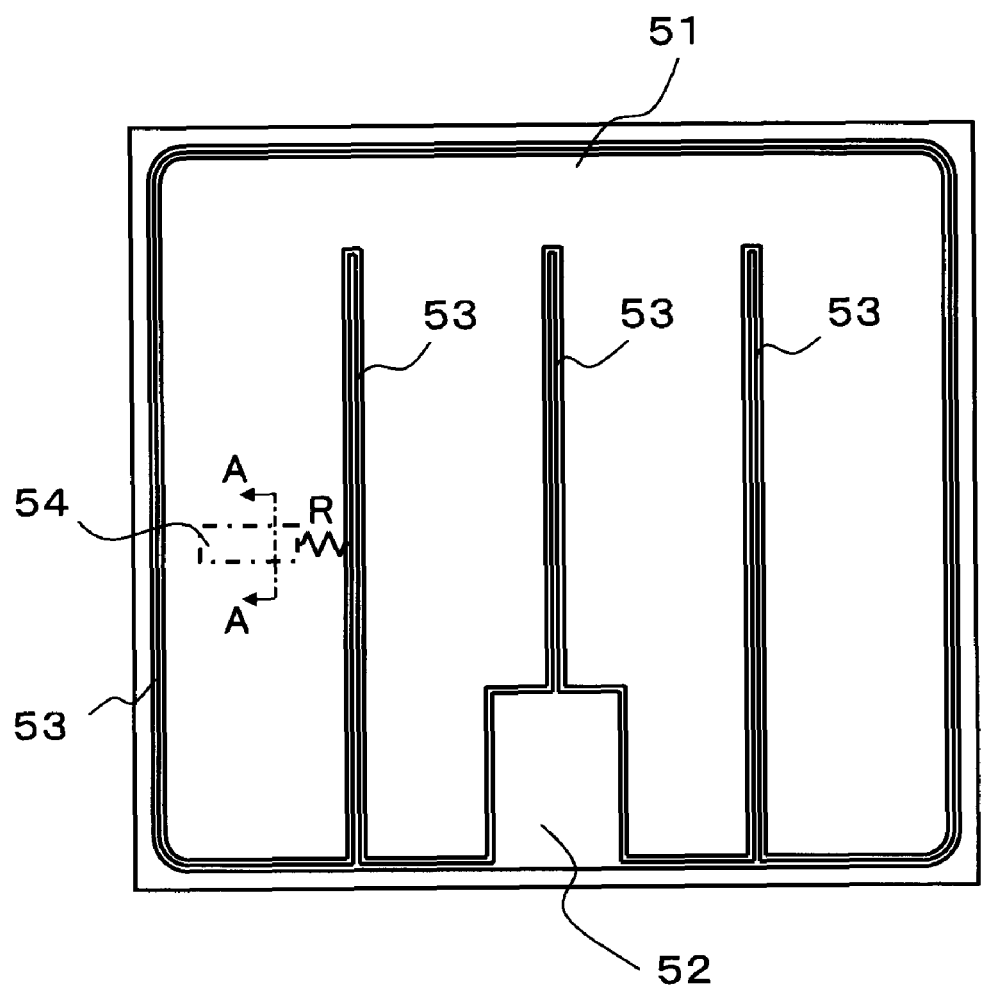
FIG. 7 is a plane view illustrating an IGBT chip that is a conventional power semiconductor device.

In Embodiment 6, the $n^+$ emitter region 9 is provided in the top of the p base layer 66, contiguously bordering on only one side of the trench gate 8; the same effects as those in Embodiment 6 can be obtained as long as the $n^+$ emitter region 9 is provided contiguously bordering on only one side of the trench gate 8. As is shown in FIG. 6, for example, the $n^+$ emitter region 9 may be provided such that a first $n^+$ emitter region 9*a* and a second $n^+$ emitter region 9*b*, each having a predetermined length, are provided in the top of the p base layer 66, contiguously bordering on the trench gate 8, paralleling the trench gate extension orientation, and being staggered on either side of the trench gate (in FIG. 6A, in the top-bottom orientation of the document, or in FIG. 6B and 6C, in the front-back orientation with respect to the document face). FIG. 6A is a plane view of one of the IGBT cells 54 shown in FIG. 7, and FIG. 6B and FIG. 6*c* are partially sectional views along Line B-B and Line C-C in FIG. 6A, respectively. In addition, in FIG. 6, the portions that are identical or equivalent to those in FIG. 5 explained in Embodiment 6 are represented by the same numerals so as to omit their explanations.

What is claimed is:

1. A power semiconductor device, comprising:

a first semiconductor layer of a first conductivity type;

a second semiconductor layer of a second conductivity type, provided on a top side of the first semiconductor layer;

a third semiconductor layer of the second conductivity type, provided on the second semiconductor layer;

a fourth semiconductor layer of the first conductivity type, provided on the third semiconductor layer;

two trench gates provided parallel and adjacent to each other, and each composed of a trench that extends from a top side of the fourth semiconductor layer, with a trench bottom portion reaching into the third semiconductor layer, a gate insulation film lining the trench, and a gate electrode filling the trench being lined with the gate insulation film, the two trench gates are arranged in close proximity to each other so as to operate as a single gate electrode having a reduced gate resistance;

two first semiconductor regions of the second conductivity type, provided contiguously bordering on only one side of each of the two trench gates that operate as the single gate electrode, located at the outer sides not facing each other of each of the two adjacent trench gates, and located in the top side of the fourth semiconductor layer;

a first main electrode that is provided on the fourth semiconductor layer and is electrically connected with the first semiconductor region; and a second main electrode provided on a bottom side of the first semiconductor layer; and two dummy trenches, each dummy trench including
  a trench that extends from the top side of the fourth semiconductor layer with the trench bottom portion reaching into the third semiconductor layer;
  an insulation film lining the trench; and
  a dummy electrode that fills the trench being lined with the insulation film and is connected with the first main electrode,
wherein a distance between the two dummy trenches that are arranged adjacent to each other is wider than a distance between the two trench gates that are arranged adjacent to each other.

2. A power semiconductor device, comprising:
a first semiconductor layer of a first conductivity type;
a second semiconductor layer of a second conductivity type, provided on a top side of the first semiconductor layer;
a third semiconductor layer of the second conductivity type, provided on the second semiconductor layer;
a fourth semiconductor layer of the first conductivity type, provided on the third semiconductor layer;
a trench gate having a trench that extends from a top side of the fourth semiconductor layer with the trench bottom portion reaching into the third semiconductor layer, a gate insulation film lining the trench, and a gate electrode filling the trench being lined with the gate insulation film;
a first semiconductor region of the second conductivity type, provided contiguously bordering on only one side of the trench gate, and in the top side of the fourth semiconductor layer;
a first main electrode that is provided on the fourth semiconductor layer and is electrically connected with the first semiconductor region;
a second main electrode provided on a bottom side of the first semiconductor layer; and
an interlayer insulating film located on top of the fourth semiconductor layer and extending into the first main electrode, the interlayer insulating film covering a portion of an upper surface of the first semiconductor region, and entirely covering an upper surface of the trench gate,
wherein the first semiconductor region includes a plurality of sections that have a predetermined length in the orientation in which the trench gate extends along the top side of the fourth semiconductor layer, and the plurality of sections are provided paralleling said trench gate extension orientation and are staggered on either side of the trench gate.

3. A power semiconductor device according to claim 2, wherein the power semiconductor device further comprises a dummy trench including;
  a trench that extends from the top side of the fourth semiconductor layer with the trench bottom portion reaching into the third semiconductor layer,
  an insulation film lining the trench, and
  a dummy electrode that fills the trench being lined with the insulation film and is connected with the first main electrode.

4. The power semiconductor device according to claim 1, further comprising:
  two interlayer insulating films located on top of the fourth semiconductor layer and extending into the first main electrode, each of the two interlayer insulating films covering a portion of an upper surface of a first semiconductor region adjacent to a trench gate, and entirely covering an upper surface of the same trench gate.

5. The power semiconductor device according to claim 1, wherein the dummy electrode that fills the trench is in direct contact with the first main electrode.

6. The power semiconductor device according to claim 2, wherein the gate electrode that fills the trench is in direct contact with the interlayer insulating film.

7. A power semiconductor device comprising:
a first semiconductor layer of a first conductivity type;
a second semiconductor layer of a second conductivity type, provided on a top side of the first semiconductor layer;
a third semiconductor layer of the second conductivity type, provided on the second semiconductor layer;
a fourth semiconductor layer of the first conductivity type, provided on the third semiconductor layer;
two trench gates provided parallel and adjacent to each other, and each composed of a trench that extends from a top side of the fourth semiconductor layer, with a trench bottom portion reaching into the third semiconductor layer, a gate insulation film lining the trench, and a gate electrode filling the trench being lined with the gate insulation film, the two trench gates are arranged in close proximity to each other so as to operate as a single gate electrode having a reduced gate resistance;
two first semiconductor regions of the second conductivity type, provided contiguously bordering on only one side of each of the two trench gates that operate as the single gate electrode, located at the outer sides not facing each other of each of the two adjacent trench gates, and located in the top side of the fourth semiconductor layer;
a first main electrode that is provided on the fourth semiconductor layer and is electrically connected with the first semiconductor region;
a second main electrode provided on a bottom side of the first semiconductor layer; and
two interlayer insulating films located on top of the fourth semiconductor layer and extending into the first main electrode, each interlayer insulating film covering a portion of an upper surface of a first semiconductor region adjacent to a trench gate and covering an entire upper surface of the same trench gate.

8. The power semiconductor device according to claim 7, further comprising a dummy trench having
  a trench that extends from the top side of the fourth semiconductor layer with the trench bottom portion reaching into the third semiconductor layer;
  an insulation film lining the trench; and
  a dummy electrode that fills the trench being lined with the insulation film and is connected with the first main electrode.

9. The power semiconductor device according to claim 8, wherein the dummy electrode that fills the trench is in direct contact with the first main electrode.

* * * * *